United States Patent
Tseng

[19]

[11] Patent Number: 6,114,202
[45] Date of Patent: Sep. 5, 2000

[54] METHOD OF FABRICATING DYNAMIC RANDOM ACCESS MEMORY

[75] Inventor: Horng-Huei Tseng, Hsinchu, Taiwan

[73] Assignee: Vanguard International Semiconductor Corp., Hsinchu, Taiwan

[21] Appl. No.: 09/329,110

[22] Filed: Jun. 9, 1999

[51] Int. Cl.[7] .................................................. H01L 21/8242
[52] U.S. Cl. ........................ 438/255; 438/255; 438/253
[58] Field of Search .................................. 438/255, 254, 438/253, 396, 399, 239, 240

[56] References Cited

U.S. PATENT DOCUMENTS

| | | | |
|---|---|---|---|
| 5,824,582 | 10/1998 | Tseng ........................................ | 438/254 |
| 5,940,710 | 8/1999 | Chung et al. ............................ | 438/305 |
| 5,956,587 | 9/1999 | Chen et al. .............................. | 438/255 |
| 5,956,594 | 9/1999 | Yang et al. .............................. | 438/396 |

*Primary Examiner*—Matthew Smith
*Assistant Examiner*—Calvin Lee
*Attorney, Agent, or Firm*—Jiawei Huang; J. C. Patents

[57] ABSTRACT

A method of fabricating a DRAM. A substrate comprising a MOS is provided. A first dielectric layer is formed on the substrate. The first dielectric layer is patterned to form a bit line contact window exposing a source region of the MOS and a node contact window exposing a drain region of the drain region simultaneously. The bit line window and the node contact window are filled with a bit line and a polysilicon plug by the formation of the same polysilicon layer, respectively. A second dielectric layer with an opening exposing the polysilicon plug is formed on the first dielectric layer. The sidewall and bottom surface of the opening are covered by another polysilicon layer. The second dielectric layer is removed to leave a node contact in contact with the polysilicon plug.

21 Claims, 3 Drawing Sheets

METHOD OF FABRICATING DYNAMIC RANDOM ACCESS MEMORY

BACKGROUND OF THE INVENTION

1. Field of the Invention

The invention relates to a method of fabricating a semiconductor device, and more particularly, to a method of fabricating a storage node as well as a bit line contact of a dynamic random access memory (DRAM).

2. Description of the Related Art

FIG. 1 shows a structure of a DRAM cell fabricated by a conventional method. A substrate comprising an isolation region 13, a gate 12, a source region 11a and a drain region 11b is provided. On the isolation region 13, a metal wire 14 may also be formed. A dielectric layer 15 is formed over the substrate 10. The dielectric layer 15 is etched to form an opening exposing then source region 11a. A bit line 16 is then formed to couple the source region 11a. After the formation of the bit line 16, another dielectric layer 17 is formed on the dielectric layer 15. An opening is formed to penetrate through both the dielectric layers 17 and 15 to expose the drain region 11b. A storage node 18 is then formed to couple with the drain region 11b.

As shown in the figure, the storage node 18 is formed to penetrate through two dielectric layers 15 and 17. A relative high aspect ratio is thus resulted. As a consequence, the step coverage for filling the opening is poor. Therefore, a poor contact quality is obtained for the storage node. Furthermore, to have bit line and the storage node form on different surface level, an uneven topography is inevitable. In addition, the fabrication cost is relatively high.

SUMMARY OF THE INVENTION

The invention provides a method of fabricating a dynamic capacitor as well as a bit line contact. A substrate comprising a metal-oxide semiconductor is provided. A dielectric layer is formed on the substrate. The dielectric layer is etched to form a bit line contact exposing a source region of the metal-oxide semiconductor and a storage node contact window exposing a drain region of the metal-oxide semiconductor simultaneously. A polysilicon layer is formed over the dielectric layer to fill both the bit line contact window and the node contact window. The polysilicon layer is patterned to form a bit line contact extending from the bit line contact window over a part of the dielectric layer and a polysilicon plug in the node contact window. Another dielectric layer is formed to cover the dielectric layer, the bit line contact and the polysilicon plug. The dielectric layer is patterned to form an opening exposing the polysilicon plug. Another polysilicon layer is formed on a sidewall and a bottom surface of the opening to leave a gap within the opening. The dielectric layer is removed to expose the bit line contact and to form the storage node comprising the patterned polysilicon layer and the polysilicon plug in contact thereto.

The invention provides a method for forming the bit line contact window and the node contact window simultaneous. Therefore, the topography of the resultant structure is smooth compared to the prior art. Furthermore, the storage node is fabricated to extend from a same surface level of the bit line contact. Apart from the further smooth topography, a smaller aspect is resulted to advantage the formation of the storage node. In addition, the fabrication cost is lowered.

It is to be understood that both the foregoing general description and the following detailed description are exemplary and explanatory only and are not restrictive of the invention, as claimed.

DESCRIPTION OF THE PREFERRED EMBODIMENTS

Figure 1:
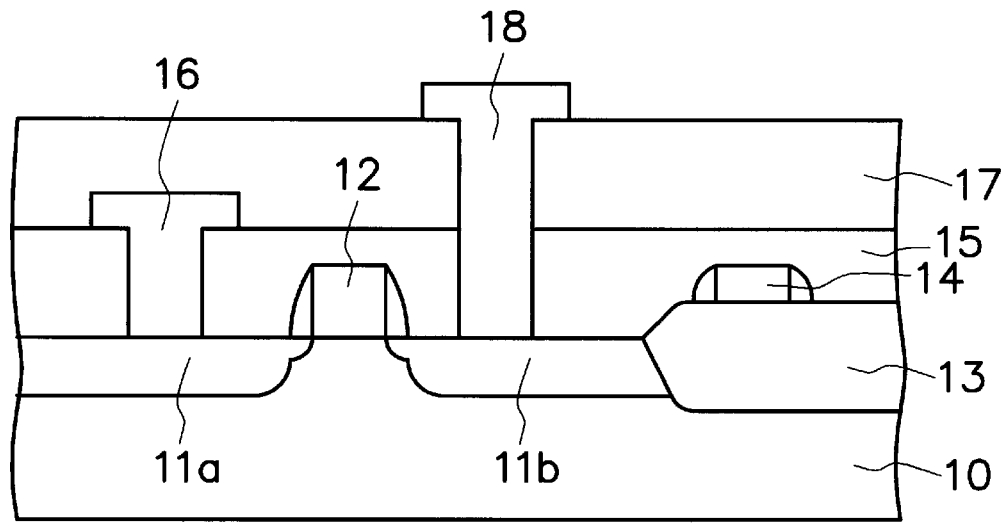
FIG. 1 shows a conventional DRAM structure fabricated by a conventional method.
Figure 2A:
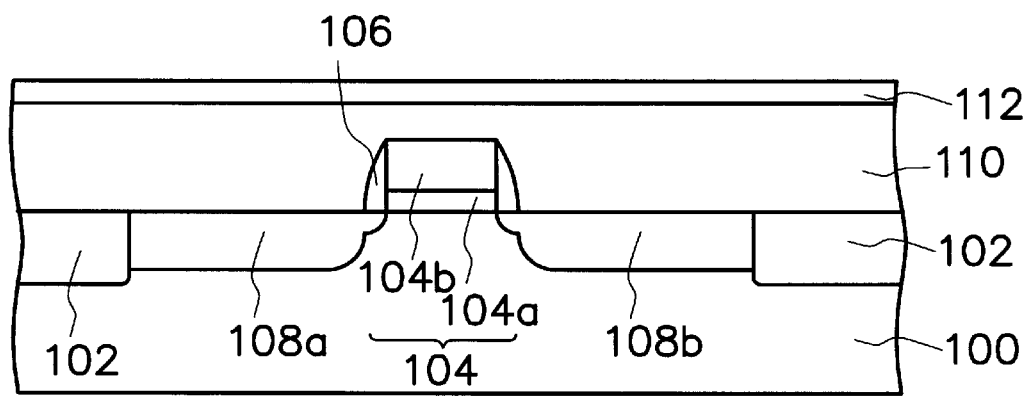
FIG. 2A to FIG. 2G are cross sectional views showing a method of fabricating a DRAM according to a preferred embodiment of the invention.

In FIG. 2A, a semiconductor substrate 100 is provided. The substrate 100 comprises a metal-oxide semiconductor (MOS) transistor in an active region defined by an isolation region 102, for example, a shallow trench isolation. The MOS transistor further comprises a source region 108a, a drain region 106b and a gate 104 composed of a gate oxide layer 104a and a gate electrode 104b with sidewalls covered by a spacer 106. A dielectric layer 110, for example, an oxide layer having a thickness of about 2000 angstroms to about 8000 angstroms is formed to cover the MOS transistor, the isolation region 102 over the substrate 100. Another dielectric layer 112, for example, a layer made of nitride, oxynitride, oxide, or the combination thereof with a thickness of about 500 angstroms to about 3000 angstroms, is formed on the dielectric layer 110. The dielectric layer 112 is the planarized by, for example, using chemical mechanical polishing (CMP).

Figure 2B:
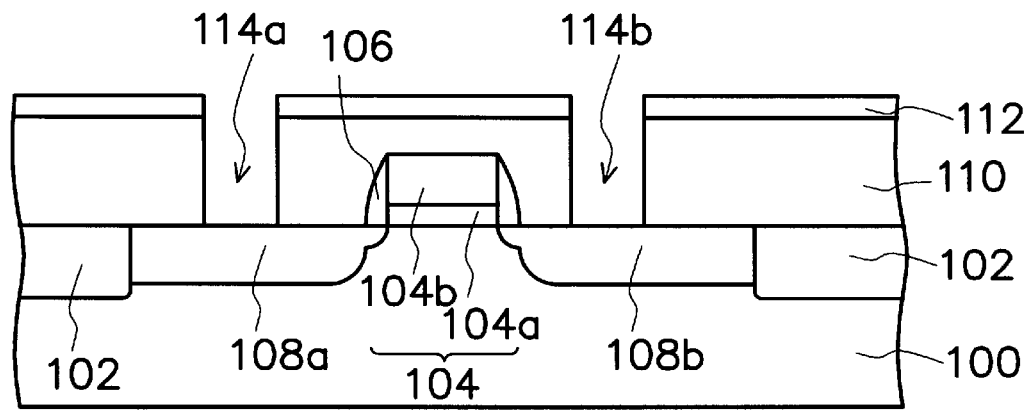

In FIG. 2B, the dielectric layers 112 and 110 are patterned to form a bit line contact window 114a exposing the source region 108a and a node contact window 114b exposing drain region 108b simultaneously.

Figure 2C:
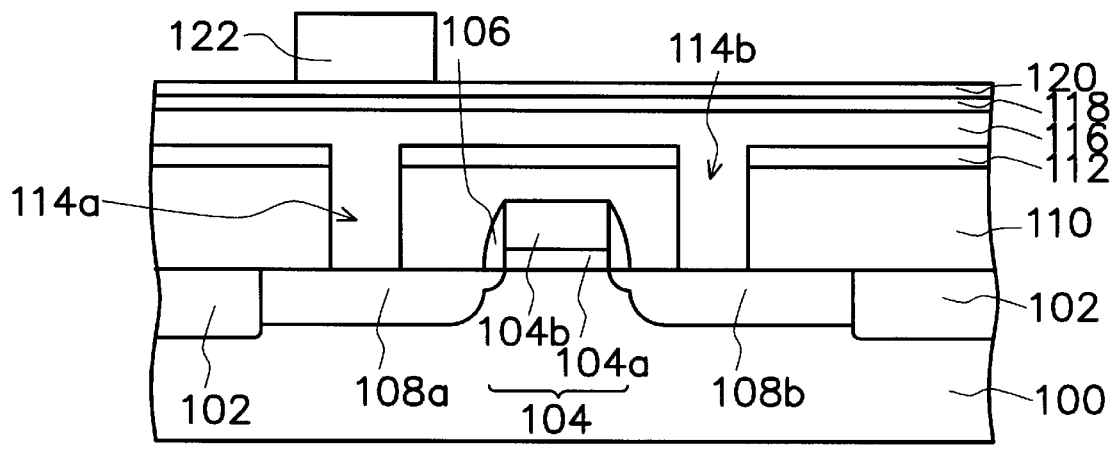

In FIG. 2C, a polysilicon layer 116 is formed on the dielectric layer 112, so as to fill both the bit line contact window 114a and the node contact window 114b simultaneously. A refractory metal layer 118, for example, a tungsten silicide layer, is then formed on the polysilicon layer 116. A capped dielectric layer 120, for example, a layer of chemical vapor deposition (CVD) silicon dioxide, nitride, oxynitride or the combination thereof, is deposited on the refractory metal layer 118. A photoresist pattern 122 serving as a bit line mask is formed on the capped dielectric layer 120 aligned over the bit line contact window 114a.

Figure 2D:
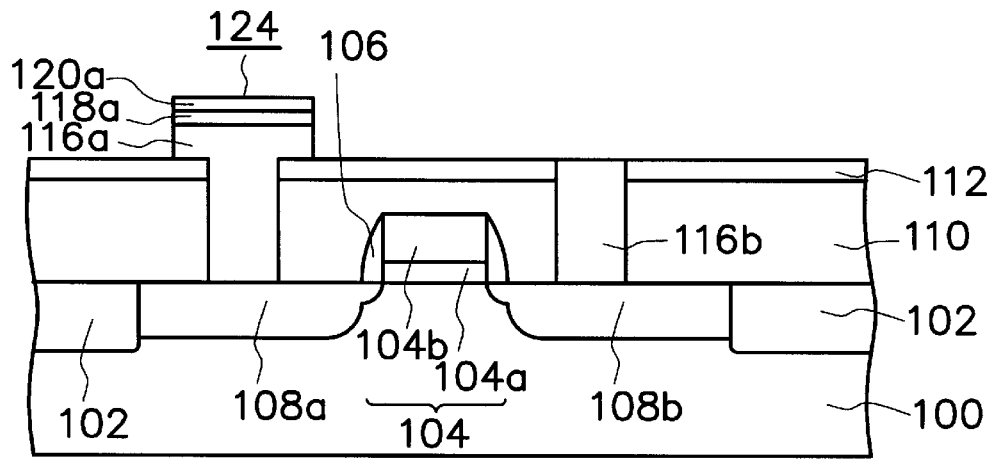

In FIG. 2D, using the photoresist pattern 122, that is, the bit line mask, as a mask, the capped dielectric layer 120, the refractory metal layer 118 the polysilicon layer 116 are etched, for example, using plasma etching process to form a bit line contact 124 filling the bit line contact window 104a (as shown in FIG. 2C) and standing out of the dielectric layer 112. Meanwhile, a polysilicon plug 116b is formed to fill the node contact window 104b (as shown in FIG. 2C). As shown in the figure, the bit line contact 124 comprises the patterned polysilicon layer 116a, the patterned refractory metal layer 118a and the patterned capped dielectric layer 120a.

Figure 2E:
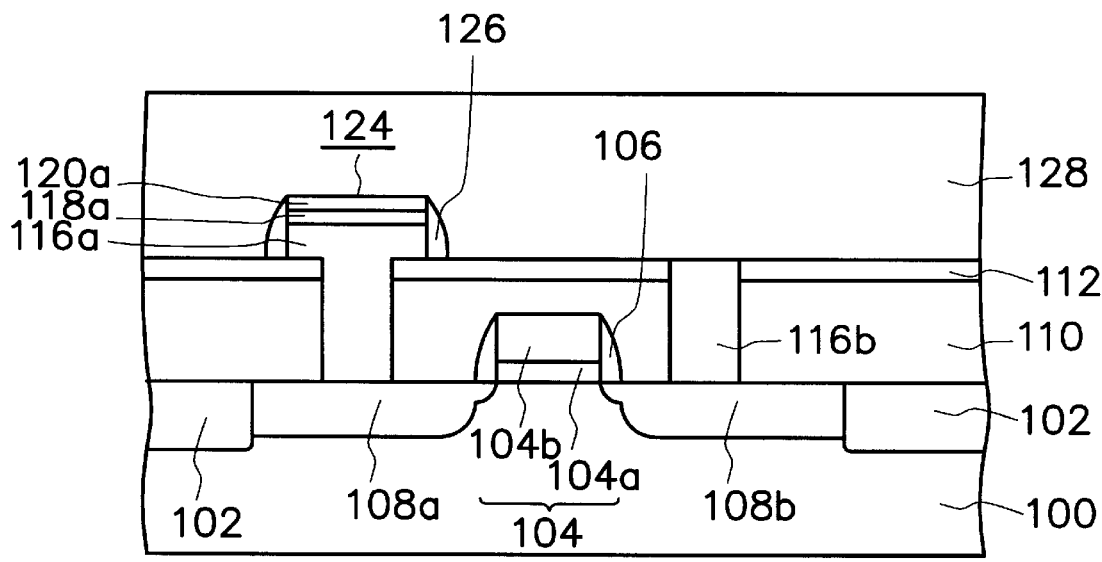

In FIG. 2E, a dielectric layer, for example, a layer made of nitride, oxynitride or a combination thereof with a thickness of about 500 angstroms to about 3000 angstroms is formed over the dielectric layer 112, the bit line contact 124 and the polysilicon plug 116b. Using plasma, the dielectric layer is etched back to form a spacer 126 covering a sidewall of the bit line contact 124. Another dielectric layer 128, for example, a CVD oxide or spin-on-glass (SOG) layer with a thickness of about 4000 angstroms to about 10000 angstroms, is formed over the bit line contact 124, the spacer 126, the dielectric layer 112 and the polysilicon plug 116b.

Figure 2F:
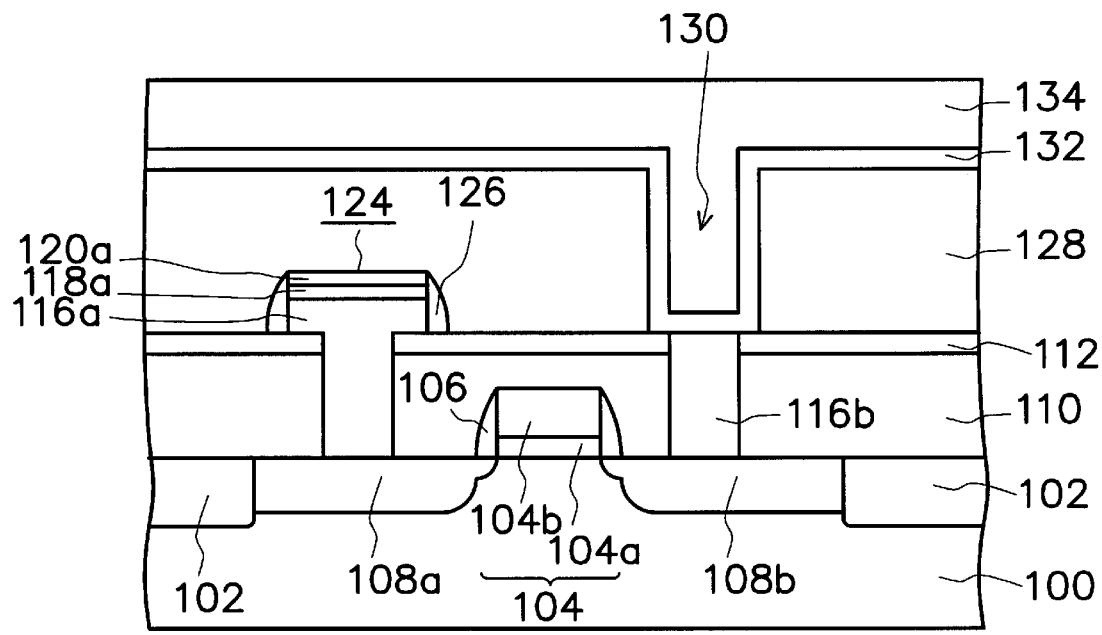

In FIG. 2F, the dielectric layer 128 is etched to form an opening 130 which exposes a the polysilicon plug 116b. A polysilicon layer 112, for example, having a thickness of about 500 angstroms to about 3000 angstroms, is formed along a surface profile of the dielectric layer 128. As a consequence, a sidewall and a bottom surface of the opening 130 is covered by the conformal polysilicon layer 132, while the opening 130 is not completely filled thereby, that is, a gap exists in the opening 130 after the formation of the polysilicon layer 132. A photoresist layer 134 or an SOG layer is coated on the polysilcion layer 132, so as to fill the gap within the opening 130.

Figure 2G:
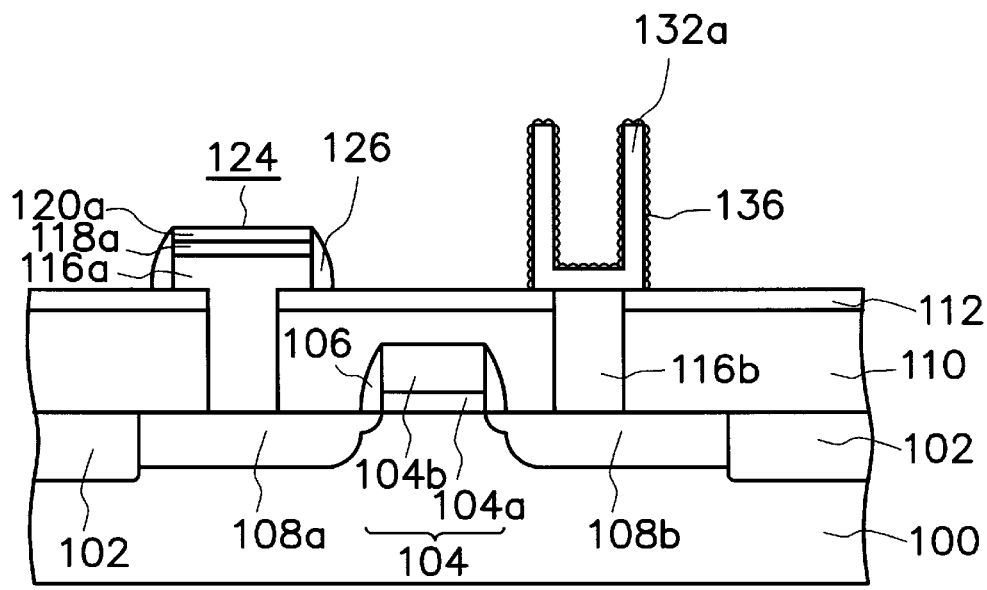

In FIG. 2G, the photoresist layer 134 is then etched to remain a spacer within the opening 130, while the photoresist layer over a top surface of the polysilicon layer 132 is removed. The formation of the spacer on the polysilicon layer 132 within the opening 130 is to protect the polysilicon layer 132 inside the opening 130 in the subsequent etching process for polysilicon. The polysilicon layer 132 over the dielectric layer 128 is then removed to remain the part of the polysilicon 132 within the opening 130 (shown in FIG. 2F) only. The dielectric layer 128 is removed until the dielectric layer 112 and the bit line contact 124 including the spacer 126 are exposed. Thus, storage node comprises the polysilicon plug 116b and the polysilicon layer 132a is formed.

Alternatively, after the formation of the polysilicon layer 132 as shown in FIG. 2F, the polysilicon layer 132 is planarized using, for example, CMP, until the dielectric layer 128 is exposed. The dielectric layer 128 is removed until the dielectric layer 112 and the bit line contact 124 including the spacer 126 are exposed, so that a storage node is formed.

To further increase the contact area of the storage node, so as to increase a capacitance of a capacitor based on this storage node, it is often that a hemispherical grain silicon layer 136 is grown along a surface of the polysilicon layer 132a. A dielectric layer, for example, a nitride/oxide layer (NO), an oxide/nitirde/oxide layer (ONO) or tantalum oxide layer, is formed on a surface of the storage node, followed by forming another polysilicon layer to serve as a plate electrode of the capacitor.

In the invention, the storage node contact window and the bit line contact window are formed simultaneously. Furthermore, the storage node and the bit line contact are formed to stand out from a same level. Therefore, compared to the conventional structure of a DRAM, the topography is smoother. In addition, the storage node is formed to couple with the drain region by only penetrating through a single dielectric layer. Therefore, the step height and aspect ratio for forming the storage node is very much reduced to obtain a better step coverage. As a result, the storage node can be formed with an improved contact quality.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a dynamic random access memory, comprising:
    providing a semiconductor substrate comprising a first doped region and a second doped region;
    forming a first dielectric layer on the substrate;
    patterning the first dielectric layer to form a bit line contact window to expose the first doped region and a node contact window to expose the second doped region simultaneously;
    forming a bit line extending out the bit line contact window and over a part of the first dielectric layer, and forming a polysilicon plug to fill the node contact window;
    forming a second dielectric layer to cover the first dielectric layer, the bit line and the polysilicon plug;
    forming an opening in the second dielectric layer to expose the polysilicon plug;
    forming a conformal polysilicon layer on a sidewall and a bottom surface of the opening; and
    removing the second dielectric layer.

2. The method according to claim 1, wherein the first doped region comprises a source region and the second doped region comprises a drain region.

3. The method according to claim 1, wherein the first dielectric layer comprises an oxide layer having a thickness of about 2000 angstroms to about 8000 angstroms.

4. The method according to claim 1, wherein the first dielectric layer comprises a third dielectric layer formed thereon.

5. The method according to claim 4, wherein the third dielectric layer comprises a layer made of nitride, oxynitride oxide or a combination thereof and has a thickness of about 500 angstroms to about 3000 angstroms.

6. The method according to claim 1, wherein the bit line further comprises a polysilicon layer filled within the bit line contact window covered by a refractory metal layer.

7. The method according to claim 1, wherein the bit line further comprises a capped dielectric layer over a polysilicon layer filled within the bit line contact window, wherein the capped dielectric layer is made of nitride, oxynitride, oxide, or a combination thereof.

8. The method according to claim 1, wherein the second dielectric layer has a thickness of about 4000 angstroms to about 10000 angstroms and is made of chemical vapor deposition oxide or spin-on glass.

9. The method according to claim 1, comprising further a step of forming a spacer on a sidewall of the bit line.

10. The method according to claim 1, wherein a gap is formed within the opening while forming the polysilicon layer.

11. The method according to claim 1, further comprising a step of forming a hemispherical grain silicon layer on the polysilicon layer.

12. A method of fabricating a dynamic random access memory, comprising:
    providing a substrate comprising a source region and a drain region;
    forming a first dielectric layer on the substrate;
    forming a second dielectric layer on the first dielectric layer;
    forming a bit line contact window in the first and the second dielectric layers to expose the source region and forming a node contact window in the first and the second dielectric layers to expose the drain region;
    forming a first polysilicon layer on the second dielectric layer to fill both the bit line contact window and the node contact window;
    forming a photoresist layer on the polysilicon layer aligned over the bit- line contact window;
    etching the first polysilicon layer with the photoresist layer as a mask until the second dielectric, layer is exposed;
    removing the photoresist layer;
    forming a third dielectric layer over the second dielectric layer;

forming an opening in the third dielectric layer aligned over the node contact window;

forming a conformal second polysilicon layer along a surface profile of the third dielectric layer and the opening;

planarizing the second polysilicon layer until the third dielectric layer is exposed; and removing the third dielectric layer.

13. The method according to claim 12, comprising further a step of planarizing the second dielectric layer.

14. The method according to claim 13, comprising further the steps of:

forming a refractory metal on the first polysilicon layer; and forming a capped dielectric layer on the refractory metal layer before forming the photoresist layer.

15. The method according to claim 12, comprising further a step of forming a spacer on a sidewall of the etched first polysilicon layer.

16. The method according to claim 12, wherein a gap is formed within the opening after forming the conformal second polysilicon layer.

17. A method of fabricating a dynamic random access memory, comprising:

providing a substrate comprising a source region and a drain region;

forming a first dielectric layer on the substrate;

forming a second dielectric layer on the first dielectric layer;

forming a bit line contact window in the first and the second dielectric layers to expose the source region and a node contact window in the first and the second dielectric layers to expose the drain region, simultaneously;

forming a first polysilicon layer on the second dielectric layer to fill both the bit line contact window and the node contact window;

forming a photoresist layer on the polysilicon layer aligned over the bit line contact window;

patterning the first polysilicon layer with the photoresist layer as a mask;

removing the photoresist layer;

forming a third dielectric layer over the second dielectric layer;

forming an opening in the second dielectric layer aligned over the node contact window;

forming a conformal second polysilicon layer along a surface profile of the third dielectric layer and the opening;

forming a dielectric spacer on the second polysilicon layer within the opening;

removing the second polysilicon layer on the third dielectric layer; and removing the dielectric spacer and the third dielectric layer.

18. The method according to claim 17, wherein the patterned first polysilicon layer comprises a bit line extending from the bit line contact window and a polysilicon plug within the node contact window.

19. The method according to claim 18, wherein the bit line further comprises a refractory metal layer on the patterned first polysilicon layer and a capped dielectric layer on the refractory metal layer.

20. The method according to claim 17, comprising further a step of forming a hemispherical grain silicon layer on the second polysilicon layer after removing the dielectric spacer.

21. The method according to claim 17, comprising further the steps as follow after removing the dielectric spacer:

forming a capacitor dielectric layer on the second polysilicon layer; and forming a third polysilicon layer on the capacitor dielectric layer.

* * * * *